(12) United States Patent
Ren

(10) Patent No.: US 11,071,219 B2
(45) Date of Patent: Jul. 20, 2021

(54) DISPLAY APPARATUS AND ELECTRONIC DEVICE

(71) Applicant: Lenovo (Beijing) Co., Ltd., Beijing (CN)

(72) Inventor: Chun Ren, Beijing (CN)

(73) Assignee: LENOVO (BEIJING) CO., LTD., Beijing (CN)

( * ) Notice: Subject to any disclaimer, the term of this patent is extended or adjusted under 35 U.S.C. 154(b) by 0 days.

(21) Appl. No.: 16/833,568

(22) Filed: Mar. 28, 2020

(65) Prior Publication Data

US 2020/0315044 A1 Oct. 1, 2020

(30) Foreign Application Priority Data

Mar. 29, 2019 (CN) .................... 201910252135.X

(51) Int. Cl.
| | |
|---|---|
| *H05K 5/02* | (2006.01) |
| *H05K 5/00* | (2006.01) |
| *H05K 5/03* | (2006.01) |
| *G06F 3/041* | (2006.01) |

(52) U.S. Cl.
CPC ......... *H05K 5/0217* (2013.01); *H05K 5/0017* (2013.01); *H05K 5/03* (2013.01); *G06F 3/041* (2013.01)

(58) Field of Classification Search
None
See application file for complete search history.

(56) References Cited

U.S. PATENT DOCUMENTS

| | | | | |
|---|---|---|---|---|
| 5,592,241 | A * | 1/1997 | Kita | ........................ H04N 5/65 |
| | | | | 348/823 |
| 7,683,541 | B2 * | 3/2010 | Sakata | ..................... H04N 5/64 |
| | | | | 313/512 |
| 7,903,195 | B2 * | 3/2011 | Sasaki | ............... G02F 1/133308 |
| | | | | 349/62 |
| 10,716,223 | B2 * | 7/2020 | Fordham | .............. G02B 6/0088 |
| 10,742,788 | B2 * | 8/2020 | Shin | ................... H04M 1/0268 |
| 2006/0187144 | A1 * | 8/2006 | Ahn | ....................... G06F 1/1601 |
| | | | | 345/37 |
| 2007/0218411 | A1 * | 9/2007 | Sakata | .................. G06F 1/1601 |
| | | | | 430/313 |
| 2009/0257189 | A1 * | 10/2009 | Wang | ..................... H05K 5/061 |
| | | | | 361/679.56 |
| 2013/0083491 | A1 * | 4/2013 | Rappoport | ............ G06F 1/1656 |
| | | | | 361/722 |
| 2013/0140965 | A1 * | 6/2013 | Franklin | ............... G06F 1/1626 |
| | | | | 312/223.1 |

(Continued)

FOREIGN PATENT DOCUMENTS

| | | |
|---|---|---|
| CN | 204066085 U | 12/2014 |
| CN | 204188914 U | 3/2015 |
| CN | 105158951 A | 12/2015 |

*Primary Examiner* — Xanthia C Cunningham
(74) *Attorney, Agent, or Firm* — Anova Law Group, PLLC

(57) ABSTRACT

A display device includes a display screen, a cover plate disposed at an upper surface of the display screen, and a connection structure having a bracket. The bracket is disposed on a surface of the cover plate away from the display screen. At least a part of a contact area between the bracket and the cover plate overlaps with the display screen along a first direction. The first direction is a direction perpendicular to a display surface of the display screen.

13 Claims, 5 Drawing Sheets

(56) References Cited

U.S. PATENT DOCUMENTS

| | | |
|---|---|---|
| 2013/0265519 A1 | 10/2013 | Yu |
| 2015/0116607 A1 | 4/2015 | Cheng et al. |
| 2015/0130767 A1* | 5/2015 | Myers .................. G06F 3/0485 345/174 |
| 2015/0331444 A1* | 11/2015 | Rappoport ............ G06F 1/1637 362/249.02 |
| 2016/0028042 A1* | 1/2016 | Lee ....................... G06F 1/1601 361/749 |
| 2018/0074553 A1* | 3/2018 | Yamazaki ................. G09F 9/30 |
| 2018/0275719 A1* | 9/2018 | Kwak ................. H04M 1/0266 |

\* cited by examiner

DISPLAY APPARATUS AND ELECTRONIC DEVICE

CROSS-REFERENCE TO RELATED APPLICATION

This application claims the priority to Chinese Patent Application No. 201910252135.X, entitled "A Display Apparatus and Electronic Device," filed on Mar. 29, 2019, the entire content of which is incorporated herein by reference.

TECHNICAL FIELD

The present disclosure relates to display technology in the field of electronics, and in particular relates to a display apparatus and an electronic device.

BACKGROUND

With the development of electronic products, electronic products have delivered more functions and stronger performances, and provided better user experience. Users also have higher requirements for the displays of electronic products. In the related art, in an electronic device such as a notebook computer, the edge of the display frame that are parallel to and close to the connection axis is relatively wide. This results in an increased overall size of the notebook computer and reduces the display area of the display screen.

SUMMARY

According to one aspect of the present disclosure, a display device is provided. The display device includes a display screen, a cover plate disposed at an upper surface of the display screen, and a connection structure having a bracket. The bracket is disposed on a surface of the cover plate away from the display screen. At least a part of a contact area between the bracket and the cover plate overlaps with the display screen along a first direction. The first direction is a direction perpendicular to a display surface of the display screen.

According to another aspect of the present disclosure, an electronic device is provided. The electronic device includes a processor portion and a display connected to the processor portion. The display includes a display screen, a cover plate disposed at an upper surface of the display screen, and a connection structure having a bracket. The bracket is disposed on a surface of the cover plate away from the display screen. At least a part of a contact area between the bracket and the cover plate overlaps with the display screen along a first direction. The first direction is a direction perpendicular to a display surface of the display screen.

The above aspects will be described in detail with accompanying drawings.

Figure 1:
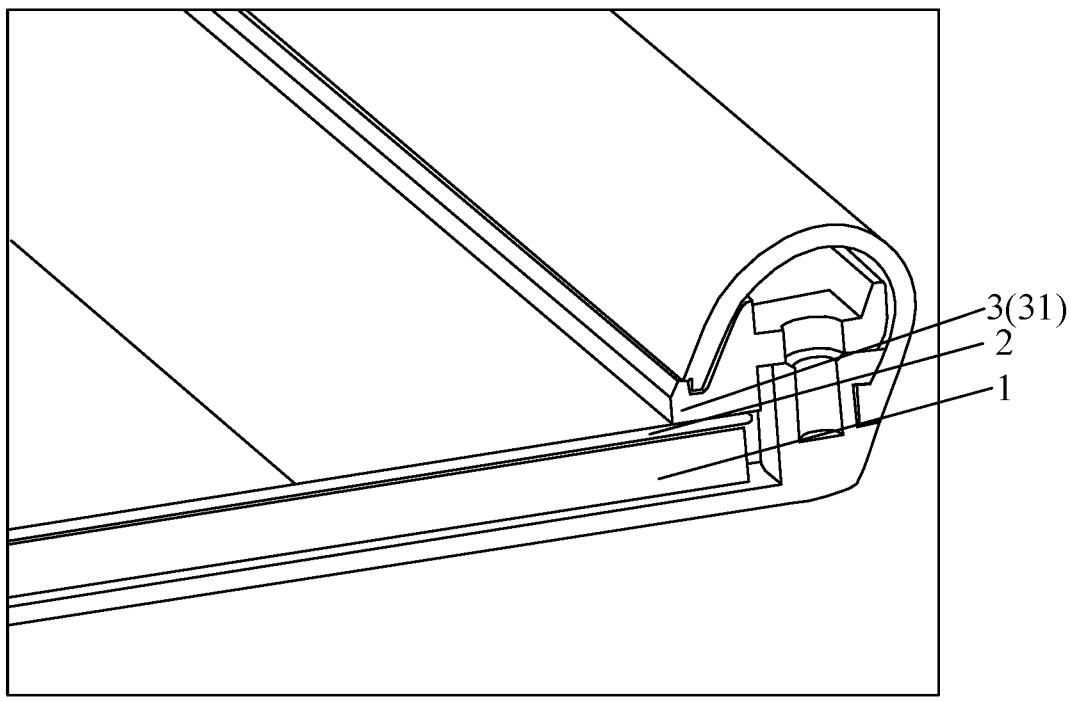
FIG. 1 is a schematic cross-sectional structural diagram of a display device according to the embodiments of the present disclosure.

Reference numerals: 1—display screen, 2—cover plate, 3—connection structure, 31—bracket, 32—fixed portion, 321 first sub-fixed portion, 322—second sub-fixed portion, 33—first connection portion, 34—protective portion, 341—first snap-in portion, 4—back cover, 5—first snap slot, 6—second snap slot, 7—bonding layer.

DETAILED DESCRIPTION OF THE EMBODIMENTS

The technical solutions in the embodiments of the present disclosure will be clearly and completely described below with reference to the accompanying drawings in the embodiments of the present disclosure.

The embodiments of the present disclosure provide a display device. Referring to FIG. 1, the display device may include: a display screen 1; a cover plate 2; and a connection structure 3, the connection structure 3 including a bracket 31. The cover plate 2 is disposed on an upper surface of the display screen 1; the bracket 31 is disposed on the surface of the cover plate 2 away from the display screen 1; and at least a part of a contact area between the bracket 31 and the cover plate 2 overlaps with the display screen 1 in a first direction. The first direction is a direction perpendicular to the display surface of the display screen.

It should be noted that the cover plate may be a transparent baseboard. In a feasible implementation manner, the cover plate may be a touch screen.

Figure 2:
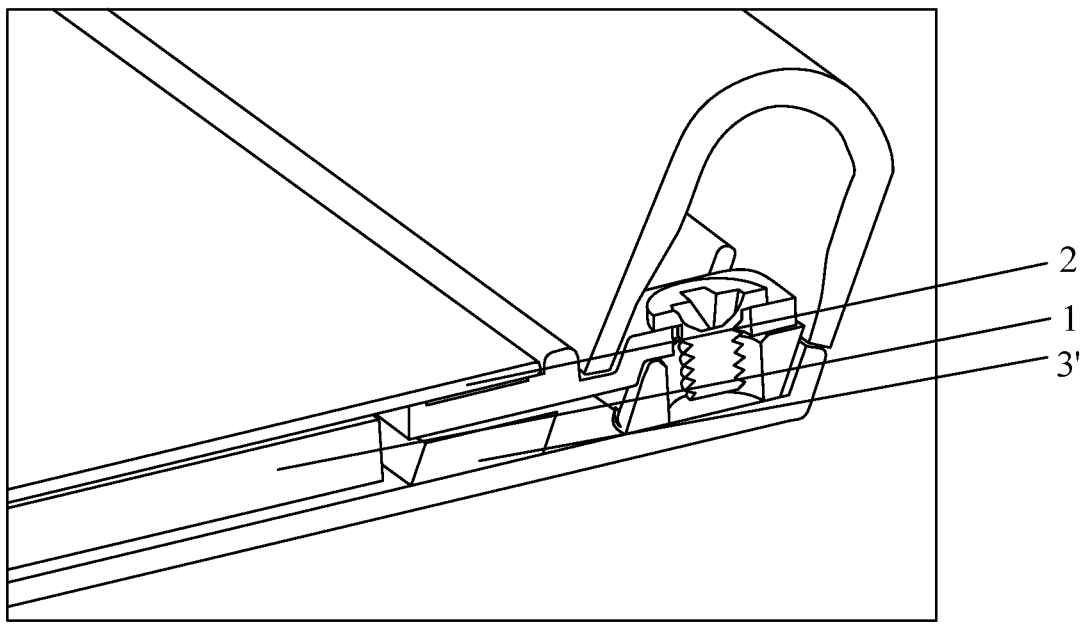
FIG. 2 is a schematic cross-sectional structural diagram of a display device in the related art.

As shown in FIG. 1, the display screen, the cover plate, and the bracket in the embodiments of the present disclosure may be disposed sequentially in a stacked manner. However, as shown in FIG. 2, the display device of an electronic device in the related art is only the display screen and the cover plate arranged in the stacked manner. As shown in FIG. 2, in the related art, a component 3' having a function similar to the function of the bracket 3 is set at the same level as the display screen. Accordingly, compared with the display device provided by the embodiments of the present disclosure, the size of the display screen in the related art is greatly reduced. Because a structure of the display device in the embodiments of the present disclosure only reduces a width of a frame that is located near the connection structure of all frames parallel to the connection structure of the display screen and does not change an overall size of the display device, accordingly, on the premise of not changing the overall size of the display device, a display area of the display screen of the display device can be increased.

In the display device provided by the embodiments of the present disclosure, the display screen, the cover plate and the bracket are sequentially stacked, rather than being disposed side by side with the display screen as in the prior art, so that the display screen can be extended toward the connection structure based on the relative technology, to solve the problem that the frame near the connection structure is too wide of all the frames parallel to the connection structure of the display screen of the electronic device in the. Accordingly, while realizing a narrow design of the frame near the connection structure of all the frames parallel to the connection structure of the display screen of the electronic device, the overall size of the electronic device can be increased and meanwhile, the display area of the display screen can also be increased.

Figure 3:
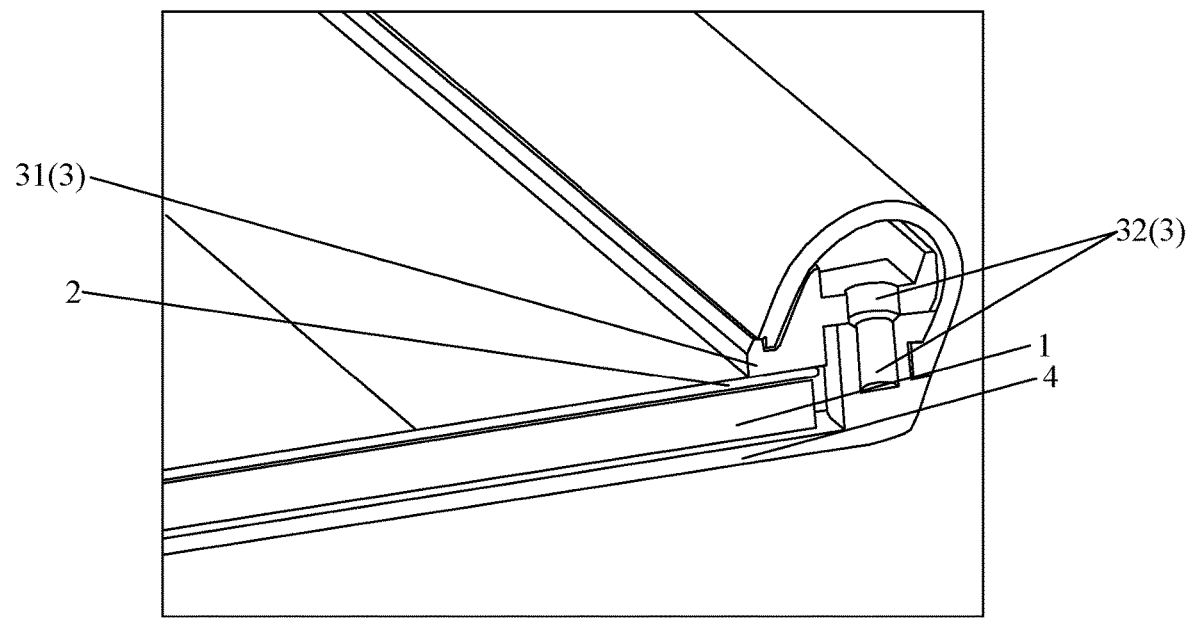
FIG. 3 is a schematic cross-sectional structural diagram of another display device according to the embodiments of the present disclosure.

Based on the foregoing described embodiments, one embodiment of the present disclosure provides a display device. Referring to FIG. 3, the display device includes: the display screen 1; the cover plate 2; the connection structure 3, the connection structure including the bracket 31; and a back cover 4.

The cover plate 2 is disposed on the upper surface of the display screen 1; the bracket 31 is disposed on the surface of the cover plate 2 away from the display screen 1; and at least a part of the contact area between the bracket 31 and the cover plate 2 overlaps with the display screen 1 in the first direction. The first direction is a direction perpendicular to the display surface of the display screen.

The first direction is a direction perpendicular to the direction of the plane on which the display screen is located; that is, the display screen, the cover plate, and the bracket may be sequentially stacked and disposed. The back cover 4 is disposed on the surface of the display screen 1 away from the cover 2, and is connected to the connection structure 3. The back cover 4 is configured to protect the display screen 1 and the cover 2.

The cover 2 may include a touch screen. As shown in FIG. 3, the display screen is disposed on the back cover; that is, the back cover, the display screen, the cover, and the bracket may be sequentially stacked and disposed. In a feasible implementation manner, the back cover may be a housing of the display device, being configured to protect internal components of the display device such as the display screen and the cover plate.

Based on the foregoing described embodiments, in other embodiments of the present disclosure, referring to FIG. 3, the connection structure 3 may further include: a fixed portion 32, the fixed portion 32 being connected to the back cover 4 and the bracket 31, respectively. The fixed portion 32 is configured to connect the bracket 31 and the back cover 4 together.

The fixed portion may be any component having a fixed effect. In a feasible implementation manner, the fixed portion may include screws, to realize the connection of the bracket and the back cover.

Figure 4:
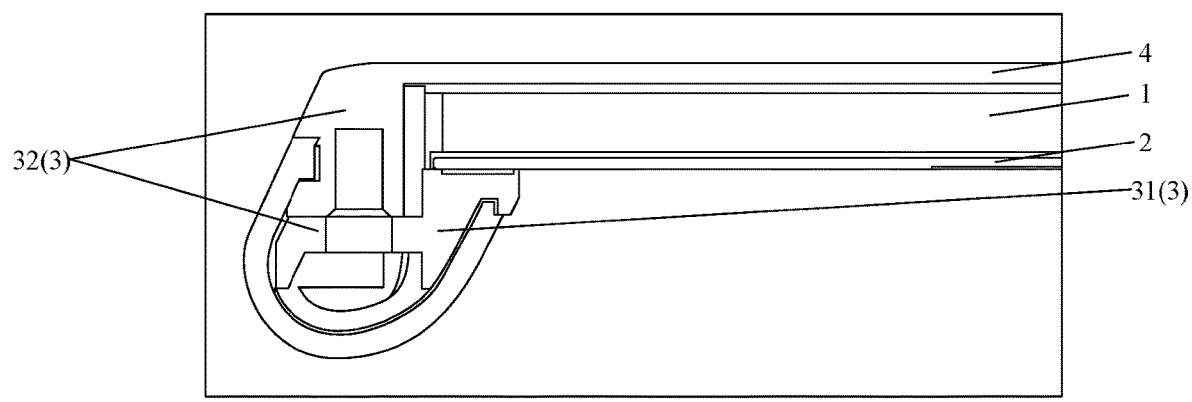
FIG. 4 is a schematic cross-sectional structural diagram of another display device according to the embodiments of the present disclosure.

It should be noted that, as shown in FIG. 4, in a cross-sectional view of another display device provided by the embodiments of the present disclosure, the fixed portion may be formed by combining two parts. Moreover, according to the structure of the display device shown in FIG. 4, apparently, the fixed portion can realize the connection of the bracket and the back cover; that is, the fixed portion can realize the fixation of the bracket.

Figure 5:
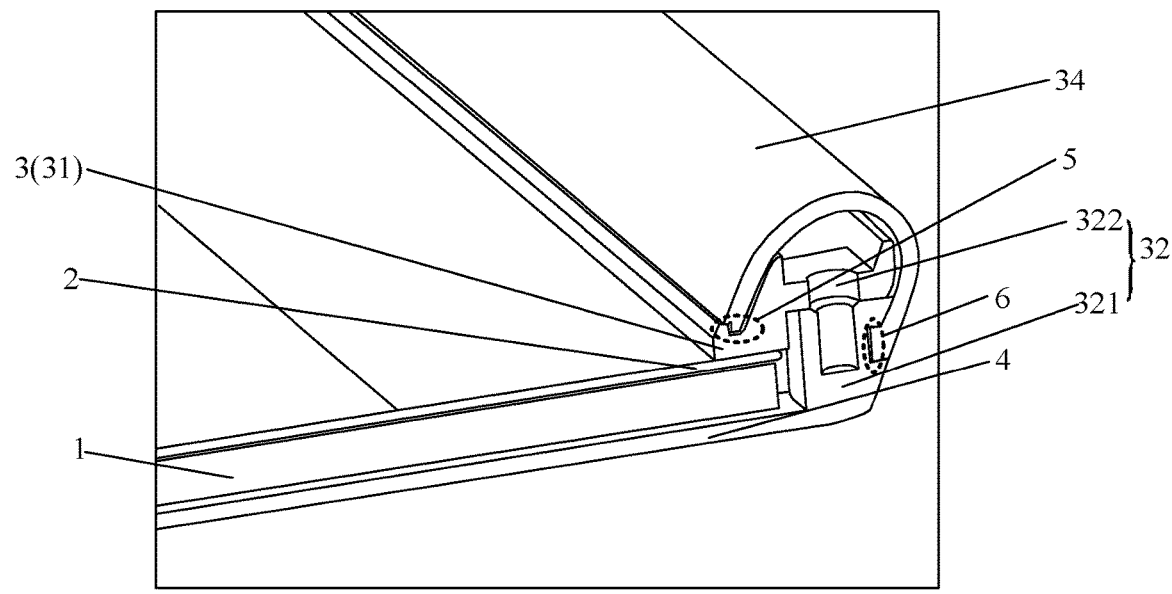
FIG. 5 is a schematic cross-sectional structural diagram of the display device according to another embodiment of the present disclosure.
Figure 6:
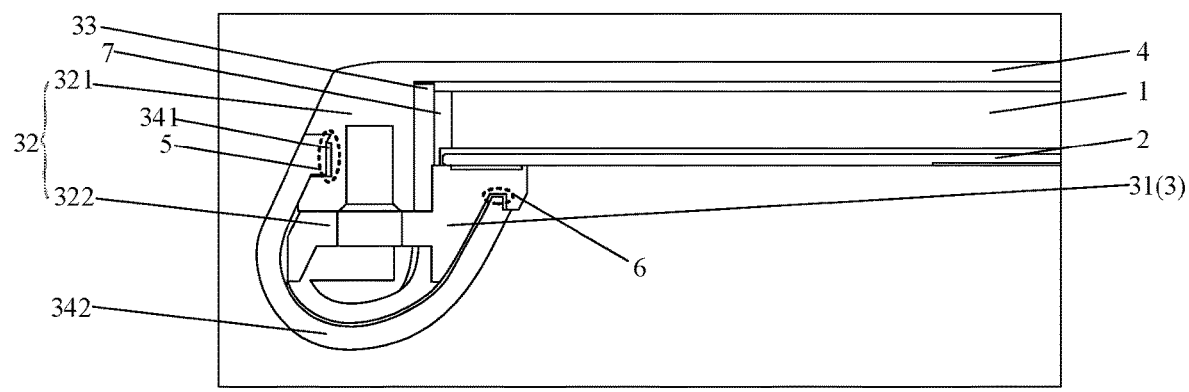
FIG. 6 is a schematic cross-sectional structural diagram of the display device according to another embodiment of the present disclosure.

In other embodiments of the present disclosure, referring to FIG. 5 and FIG. 6, the fixed portion 32 may include: a first sub-fixed portion 321, the first sub-fixed portion 321 being connected to the back cover 4; and a second sub-fixed portion 322, the second sub-fixed portion 322 being connected to the bracket 31. The first fixed portion and the second fixed portion are snapped together.

It should be noted that the first fixed portion and the second fixed portion can be snapped together; and after the first fixed portion and the second fixed portion are snapped together, under a joint action of the first fixed portion and the second fixed portion, the connection between the bracket and the back cover can be realized, so that the bracket can be fixed.

In a feasible implementation manner, the first fixed portion may include a bolt, and the second fixed portion may include a nut; the bolt and the nut may play lock each other, so that when the bolt and the nut are locking each other, under a joint action of the bolt and the nut, the bracket and the back cover can be connected together to fix the bracket.

In another embodiment of the present disclosure, referring to FIG. 6, the connection structure 3 may further include a first connection portion 33, and the first connection portion 33 is connected to the fixed portion 32 and the bracket 31. The first connection portion 33 is also connected to a side of the display screen 1 and the cover plate 2 that is close to the connection structure. The first connection portion is configured to fix the cover plate.

As shown in FIG. 6, the first connection portion may connect the fixed portion and the bracket together. Of course, in a feasible implementation manner, the first connection portion may connect the first sub-fixed portion of the fixed portion and the bracket together. Moreover, according to the structure shown in FIG. 6, the bracket and the second sub-fixed portion may also be connected together.

In another embodiment of the present disclosure, referring to FIG. 5, the connection structure 3 may further include a protective portion 34. The protective portion 34 is connected to the fixed portion 32 and the bracket 31, respectively. The protective portion is configured to protect components at the connection structure.

As shown in FIG. 5, the protective portion may be located at an outermost layer of an entire connection structure, and then the protective portion may realize a protective effect of the components included in the entire connection structure.

In other embodiments of the present disclosure, referring to FIGS. 5 and 6, at least one first snap slot 5 is disposed at the first sub-fixed portion. The protective portion 34 includes a first snap-in portion 341, and the first snap-in portion 341 is disposed in the at least one snap card slot 5.

In some embodiments, the first snap-in portion is illustrated in FIG. 6. As shown in FIG. 6, the first snap-in portion in disposed in the first snap slot.

The protective portion 34 further includes a protective portion 342. One end of the protective portion 342 is connected to the first snap-in portion 341, and the other end of the protection portion 342 is connected to the bracket 31.

At least one second snap slot 6 is disposed at the bracket 31. The other end of the protective portion 342 is disposed in the at least one second snap slot 6.

It should be noted that, the protective portion in the embodiments of the present disclosure is connected to the first sub-fixed portion through the first snap-in portion disposed in the first snap slot. At the same time, the protective portion in the embodiments of the present disclosure can also realize a connection between the protective portion and the bracket through the protective portion disposed in the second snap slot.

Based on the foregoing embodiment, in another embodiment of the present disclosure, referring to FIG. 6, the display device may further include a bonding layer 7. The bonding layer 7 is disposed at a position where the connection structure 3 is located.

The bonding layer is configured to connect the side of the display screen near the connection structure with the connection structure.

Of course, the bonding layer in the embodiments of the present disclosure may also be disposed at other positions in the display device to achieve bonding to complete the bonding and fixation of the entire components of the display device. In FIG. 6, the position of the bonding layer is only exemplary but not limited to this position.

Figure 7:
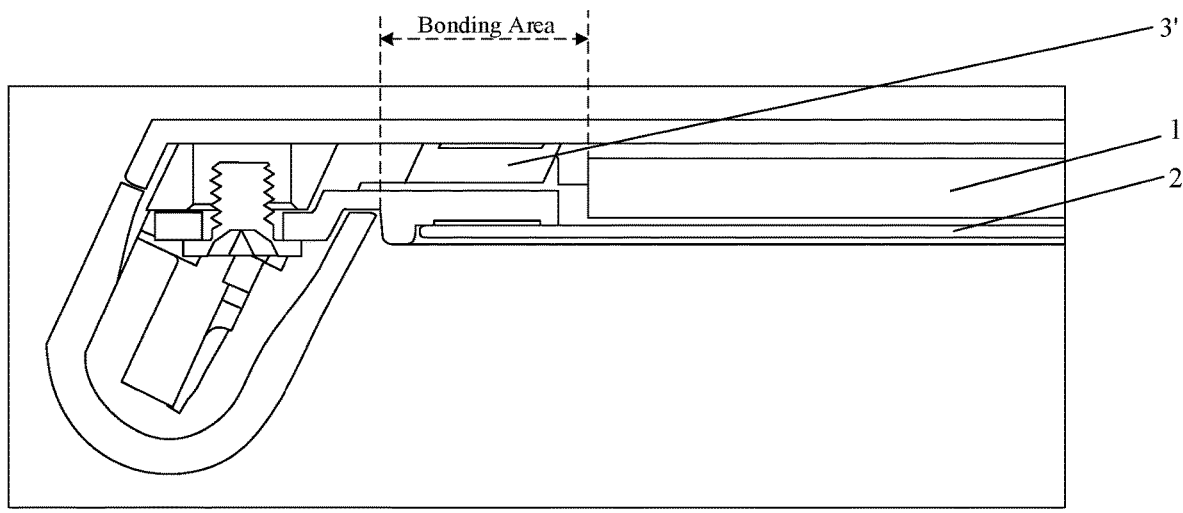
FIG. 7 is a schematic cross-sectional structural diagram of another display device in the related art.

It should be noted that FIG. 7 is a schematic cross-sectional structural diagram of a display device provided by a solution in the relative technology. As shown in FIG. 7, there is a relatively large distance between the display screen and the connection structure in the structure of the display device provided by the relative technology. This distance is configured to be the bonding area that realizes bonding, which can result in a greatly reduced display area of the display screen. However, according to the structure of the display device provided by the embodiments of the present disclosure as shown in FIG. 6, a display screen is disposed in the display device provided by the embodiments of the present disclosure corresponding to the bonding area in the relative technology. That is, the display screen extends a length toward the connection structure, so that the display area of the display screen of the display device provided by the embodiments of the present disclosure can be increased, and the overall size of the display device need not be increased.

Figure 8:
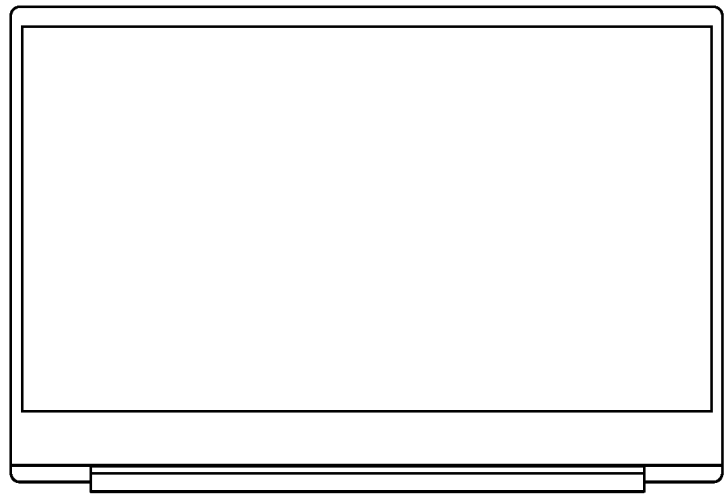
FIG. 8 is a schematic diagram of the display device product in the related art.
Figure 9:
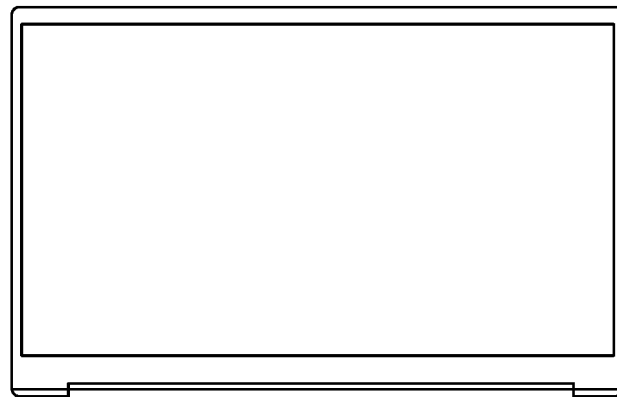
FIG. 9 is a schematic diagram of the display device product according to the embodiments of the present disclosure.

In addition, FIG. 8 is a schematic diagram of the display device product illustrated by the solution provided by the relative technology, and FIG. 9 is a schematic diagram of the display device product according to the embodiments of the present disclosure. By comparing the product as shown in FIG. 8 with the product as shown in FIG. 9, the frame near the connection structure of the product shown in FIG. 9 is significantly narrower than the frame near the connection structure of the product shown in FIG. 8. That is, the frame near the connection structure of the display device provided by the embodiments is narrower than the frame near the connection structure of the display device provided by the relative technology.

In addition, it should be noted that FIG. 1 to FIG. 7 are only schematic structural diagrams showing a part of the cross-sectional structure of the display device, and the entire schematic structural diagram of the display device is not shown.

The display device provided by the embodiments of the present disclosure includes a display screen, a cover plate and a bracket which are sequentially stacked rather being disposed side by side with the display screen as in the prior art, so that the display screen can extend toward the connection structure based on the relative technology, which solves the problem that of all the frames parallel to the connection structure of the display screen of the electronic device in the relative technology, the frame near the connection structure is too wide. Accordingly, while realizing the narrow design of the frame near the connection structure of all the frames parallel to the connection structure, the overall size of the electronic device need not be increased. And at the same time, the display area of the display screen can be increased.

Based on the foregoing described embodiments, some embodiments of the present disclosure provide an electronic device, and the electronic device includes a display device provided by the embodiments corresponding to FIGS. 1, and 3 to 6.

In the description of the present disclosure, descriptions after the terms such as "certain embodiments", "one embodiment", "some embodiments", "exemplary embodiments", "examples", "specific examples", "some examples" or "other embodiments of the present disclosure" indicate that specific features, structures, materials, or characteristics made in conjunction with the embodiments or examples are included in at least one embodiment or example of the present disclosure. In the present disclosure, the schematic descriptions following the above terms do not necessarily refer to the same implementation or example. Moreover, the particular features, structures, materials, or characteristics described may be combined in any suitable manner in any one or more implementations or examples.

In the description of the present disclosure, it should be noted that the terms such as "connected" should be understood in a broad sense unless otherwise specified and limited. For example, it can be fixed connection, detachable connection, or integrated connection; it can be mechanical connection, electrical connection or communication with each other; it can be directly connected or indirectly connected through an intermediate medium; it can be internal connection of two components or interaction between two components. For those of ordinary skill in the art, the specific meanings of the above terms in the present disclosure can be understood according to specific situations.

In addition, in the description of the present disclosure, it should be understood that the orientation or positional relationship indicated by the terms such as "width", "upper", "inside", "outer", etc., is based on the orientation or positional relationship shown in the drawings. It is only for the convenience of describing the present disclosure and simplifying the description, and does not indicate or imply that the device or element referred to must have a specific orientation, be constructed and operated in a specific orientation, and thus cannot be understood as a limitation on the present disclosure. The terms "first" and "second" are used for descriptive purposes only, and cannot be understood as indicating or implying relative importance or implicitly indicating the number of the indicated technical features. Therefore, the features defined as "first" and "second" may explicitly or implicitly include at least one of the features. In the description of the present disclosure, the meaning of "a plurality" is at least two, for example, two, three, etc., unless it is specifically defined otherwise.

The above are only the preferred embodiments of the present disclosure, and are not intended to limit the scope of the present disclosure. Any equivalent structural transformation made by using the description and drawings of the present disclosure or made by directly or indirectly using the present disclosure in other related technical fields are included in the scope of the present disclosure.

What is claimed is:

1. A display device, comprising:
   a display screen;
   a cover plate disposed at an upper surface of the display screen; and
   a connection structure having a bracket, the bracket being disposed on a surface of the cover plate away from the display screen; wherein:
   at least a part of a contact area between the bracket and the cover plate overlaps with the display screen along a first direction, the first direction being a direction perpendicular to a display surface of the display screen.

2. The display device according to claim 1, further comprising:
   a back cover, the back cover being disposed on a surface of the display screen away from the cover plate and connected to the connection structure, and being configured to protect the display screen and the cover plate, the cover plate including a touch screen.

3. The display device according to claim 2, wherein the connection structure further comprises:
a fixed portion,
the fixed portion being respectively connected to the back cover and the bracket, connecting the bracket and the back cover.

4. The display device according to claim 3, wherein the fixed portion comprises:
a first sub-fixed portion connected to the back cover, and
a second sub-fixed portion connected to the bracket,
the first fixed portion and the second fixed portion being connected by snap-fit.

5. The display device according to claim 4, wherein the connection structure further comprises:
a first connection portion connected to the fixed portion and the bracket,
the first connection portion being connected to a side of the display screen and the cover plate near the connection structure, and being configured to fix the cover plate.

6. The display device according to claim 4, wherein the connection structure further comprises:
a protective cover, being respectively connected to the fixed portion and the bracket and configured to protect components of the connection structure.

7. The display device according to claim 6, wherein:
a snap slot is disposed at the first sub-fixed portion; and
the protective cover comprises:
a first snap-in portion disposed in the at least one first snap slot; and
a protective portion, one end of the protective portion being connected to the first snap-in portion, and the other end of the protective portion being connected to the bracket.

8. The display device according to claim 7, wherein at least one second snap slot is disposed at the bracket, and the other end of the protective portion is disposed in the at least one second snap slot.

9. The display device according to claim 1, further comprising:
a bonding layer disposed at a position where the connection structure is located,
the bonding layer being configured to connect a side of the display screen near the connection structure to the connection structure.

10. An electronic device, comprising:
a processor portion, and
a display connected to the processor portion, wherein the display comprises:
a display screen;
a cover plate disposed at an upper surface of the display screen; and
a connection structure having a bracket, the bracket being disposed on a surface of the cover plate away from the display screen, at least a part of a contact area between the bracket and the cover plate overlapping with the display screen along a first direction, the first direction being a direction perpendicular to a display surface of the display screen.

11. The electronic device according to claim 10, wherein the display further comprises:
a back cover,
the back cover being disposed on a surface of the display screen away from the cover plate and connected to the connection structure, and being configured to protect the display screen and the cover plate, the cover plate including a touch screen.

12. The electronic device according to claim 11, wherein the connection structure further comprises:
a fixed portion including a first sub-fixed portion configured to be connected to the back cover and a second sub-fixed portion configured to be connected to the bracket, the first sub-fixed portion and the second sub-fixed portion being connected by snap-fit; and
a protective cover, being respectively connected to the fixed portion and the bracket.

13. The electronic device according to claim 12, wherein:
a first snap slot is disposed at the first sub-fixed portion and at least one second snap slot is disposed at the bracket; and
the protective cover comprises:
a first snap-in portion disposed at the at least one first snap slot; and
a protective portion, one end of the protective portion being connected to the first snap-in portion, and the other end of the protective portion being connected to the bracket and being disposed at the at least one second snap slot.

* * * * *